United States Patent [19]
Bailey et al.

[11] Patent Number: 5,654,672
[45] Date of Patent: Aug. 5, 1997

[54] PRECISION BIAS CIRCUIT FOR A CLASS AB AMPLIFIER

[75] Inventors: Peter David Bailey; Paul William Schwerman, both of Phoenix; Peter James Bobrowitz, Glendale, all of Ariz.

[73] Assignee: Honeywell Inc., Minneapolis, Minn.

[21] Appl. No.: 626,304

[22] Filed: Apr. 1, 1996

[51] Int. Cl.$^6$ ........................................... H03F 3/04
[52] U.S. Cl. ............................ 330/289; 330/296
[58] Field of Search ........................... 327/530, 538; 330/127, 289, 296

[56] References Cited

U.S. PATENT DOCUMENTS

| | | | |
|---|---|---|---|
| 3,286,138 | 11/1966 | Shockley | 257/581 |
| 3,906,386 | 9/1975 | Hongu et al. | 330/289 |
| 4,092,613 | 5/1978 | Boubouleix | 330/289 |
| 4,242,598 | 12/1980 | Johnson et al. | 307/310 |
| 5,150,076 | 9/1992 | Asazawa | 330/296 |
| 5,160,898 | 11/1992 | Black | 330/284 |
| 5,220,290 | 6/1993 | Black | 330/279 |

FOREIGN PATENT DOCUMENTS 60-214108  10/1985  Japan ...................... 330/289

OTHER PUBLICATIONS

Martin, W.L., "Temperature Sensing and Compensating Reference Voltage Supplies", IBM Tech. Disc. Bull., vol. 7, No. 5, pp. 357–358 Oct. 1964.

*Primary Examiner*—Steven Mottola
*Attorney, Agent, or Firm*—Brian C. Downs; Ronald E. Champion

[57] ABSTRACT

A novel bias circuit provides precise base emitter voltage ($V_{BE}$) which tracks the temperature coefficient of an RF transistor using low cost devices. The bias circuit includes a precision current source which injects current through a P-N junction device to derive a temperature compensating reference voltage thereacross. The P-N junction device is isolated from current fluctuations using a current isolation circuit coupled between the P-N junction device and the base of the RF transistor. The diode is thereby isolated from and unaffected by changes in the base current of the RF transistor. Multiple RF transistors are biased from the single P-N junction device by replicating only a trimming potentiometer and the current isolation circuitry for each additional RF transistor to be biased.

19 Claims, 3 Drawing Sheets

PRECISION BIAS CIRCUIT FOR A CLASS AB AMPLIFIER

BACKGROUND OF INVENTION

The present invention relates generally to power amplifiers and more specifically to bias circuits for transistors biased in class AB mode.

The use of power amplifiers for transmitting radio frequency signals has many applications, including, but not limited to, radio transmitters, television transmitters, CB radios, microwave links, traffic alert and collision avoidance systems(TCAS) and satellite communications systems.

A critical component of a power amplifier is the voltage bias circuitry for biasing the RF power transistor. For optimal operation, the base emitter voltage of the RF transistor must be precisely controlled over temperature. RF transistors operating class A are easily stabilized over temperature using some type of resistive feedback. Unfortunately, transistors operating class AB are precluded from using feedback to stabilize the RF transistor and more complex bias circuits are necessary.

A typical prior art bias circuit for a class AB transistor is shown in FIG. 1 and operates as follows. The circuit uses a current source 11 which injects current into a reference diode 12 to derive a temperature compensating voltage drop thereacross. An adjustable voltage divider circuit comprising resistor 14A and variable resistor 14B are coupled between diode 12 and transistor 13 for making fine adjustments to the $V_{BE}$(base-emitter voltage). Typically a large fraction of the voltage drop across diode 12 is applied to the base of transistor 13.

There are several problems with the prior art bias circuits. One problem is that prior art circuits do not precisely track and compensate for temperature characteristics of RF transistors. Even when a diode is selected which exactly matches the characteristics of the RF transistor, the prior art circuits are unable to provide precise $V_{BE}$ over a wide temperature range and production variations of the RF transistors. Consequently, the RF transistor does not operate efficiently, may "burn-up" or have a reduced MTBF(mean time between failure).

Another problem with the prior art are the expensive high-power P-N junction devices required to achieve good temperature tracking. The alternative is to use an inexpensive lower-power P-N junction device which provide poor temperature tracking. Thus, applications requiring good temperature tracking are forced to use expensive P-N devices which are large and require high-power (e.g. typically in the range of 100–200 milliamps) to operate.

Yet another problem with the prior art is that either a specific P-N junction device is recommended for use with a target RF transistor or numerous P-N junction devices must be tested to find one which substantially matches the temperature characteristics of the target RF transistor. Further, a small change in the target RF transistor(e.g. a manufacturing change) may require a new search for a matching P-N junction device. This process can be both time consuming and expensive.

Still yet another problem with the prior art is the dependence of the temperature tracking capability of the diode 12 on the fine adjustment of resistors 14. It has been found that adjustments to resistor 14B can alter the temperature tracking capability of diode 12. Thus it is difficult to optimize both the temperature tracking of diode 12 and the setpoint.

No one has yet solved the problem of providing precise $V_{BE}$ for a class AB transistor over a wide temperature range in a cost effective manner.

Class AB transmitters would be improved by a bias circuit which precisely controls $V_{BE}$ over temperature and independent of $V_{BE}$ setpoint adjustments, uses low cost, low power devices, and can use generic P-N junction devices.

Clearly there exists a need for an improved bias circuit for class AB amplifiers.

SUMMARY OF THE INVENTION

The invention discloses a voltage bias circuit for generating precise base emitter voltage($V_{BE}$) which tracks the temperature coefficient of an RF transistor using low cost devices.

The circuit includes a precision current source which supplies current to a P-N junction device to derive a temperature compensating reference voltage thereacross. The P-N junction device and current source are isolated from current fluctuations in other portions of the circuit by a current isolation circuit coupled between the P-N junction device and the base of the RF transistor. The P-N device is thereby isolated from and unaffected by changes in the base current of the RF transistor.

In addition, multiple RF transistors can be biased using the reference voltage from the single P-N junction device thus providing additional savings.

It is believed that a cause of the problems with the prior art is due in part to current variations in the prior art circuits which alter current through the P-N junction device or diode thereby degrading the diode's temperature tracking ability.

A prior art circuit Shown in FIG. 1 illustrates how diode current is altered. Base current($I_B$) of RF transistors vary over temperature and also vary between transistors. This base current may flow into the transistor, out of the transistor, or there may be no base current. When the base current of transistor 13 increases, current is diverted from current source 11 and consequently current through diode 12 is reduced. Likewise, when the base current of transistor 13 decreases or flows out of the base, current through diode 12 increases.

Although there are several variations of this basic prior art bias circuit, they all suffer this same fundamental problem to varying degrees. The invention solves this and other problems in the prior art. The invention is described below.

The current source and P-N junction device of the invention are conventional devices. The preferred embodiment uses a diode as the P-N junction device and a conventional precision current source. A key to the invention is that current through the diode is carefully controlled and adjusted such that voltage across the diode accurately tracks the temperature characteristics of the target RF transistor. This allows a generic P-N junction device to be used to match the temperature characteristic of the RF transistor and eliminates the need to screen many P-N devices. A trim potentiometer, coupled between the current source and the diode allows fine adjustments or trimming of the reference voltage.

Another key to the invention is the current source and diode being isolated from current fluctuations in other portions of the circuit so that current through the diode is not affected or changed. This permits low power, low cost P-N devices to precisely track the temperature characteristics of the RF transistor since the tracking capability of the P-N device is not affected by current fluctuations in the base of the RF transistor and elsewhere.

Current isolation is provided by an isolation circuit. The preferred embodiment uses an operational amplifier to achieve current isolation. The non-inverting input of the operational amplifier is coupled to the sliding connection of the potentiometer and the output of the operational amplifier is coupled to the base of the target RF transistor. The characteristics of the operational amplifier effectively isolate the P-N device from current fluctuations in other portions of the circuit.

The invention is also capable of biasing multiple RF transistors from the single P-N junction device and single current source. Because of the unique design, multiple RF transistors can be biased from a single P-N junction device without degrading the P-N device's temperature tracking capability. Only the trim potentiometer and the isolation circuitry need to be replicated for each additional RF transistor to be biased. This design reduces cost, power usage, and heat dissipation.

The invention is useful in any device which uses transistors in class AB mode.

Therefore, objects of the invention are to improve performance and reliability of class AB transmitters and also to reduce costs.

A feature of the invention is a precise current source driving a P-N junction device which is isolated from current variations in other stages of the circuit.

An advantage of the invention is the ability to provide a precise base emitter voltage which tracks the temperature coefficient of an RF transistor.

Another advantage of the invention is the ability to use low cost and low power P-N junction devices to generate precise temperature tracking of the target RF transistor.

Another advantage of the invention is the ability to adjust the bias setpoint without affecting the temperature tracking capability of the P-N junction device.

Yet another advantage of the invention is the ability to use generic P-N junction devices.

Still another advantage of the invention is the ability to bias multiple RF transistors using a single P-N junction device.

The significant features of the invention are illustrated in the figures and described more fully below.

DETAILED DESCRIPTION

Figure 1:
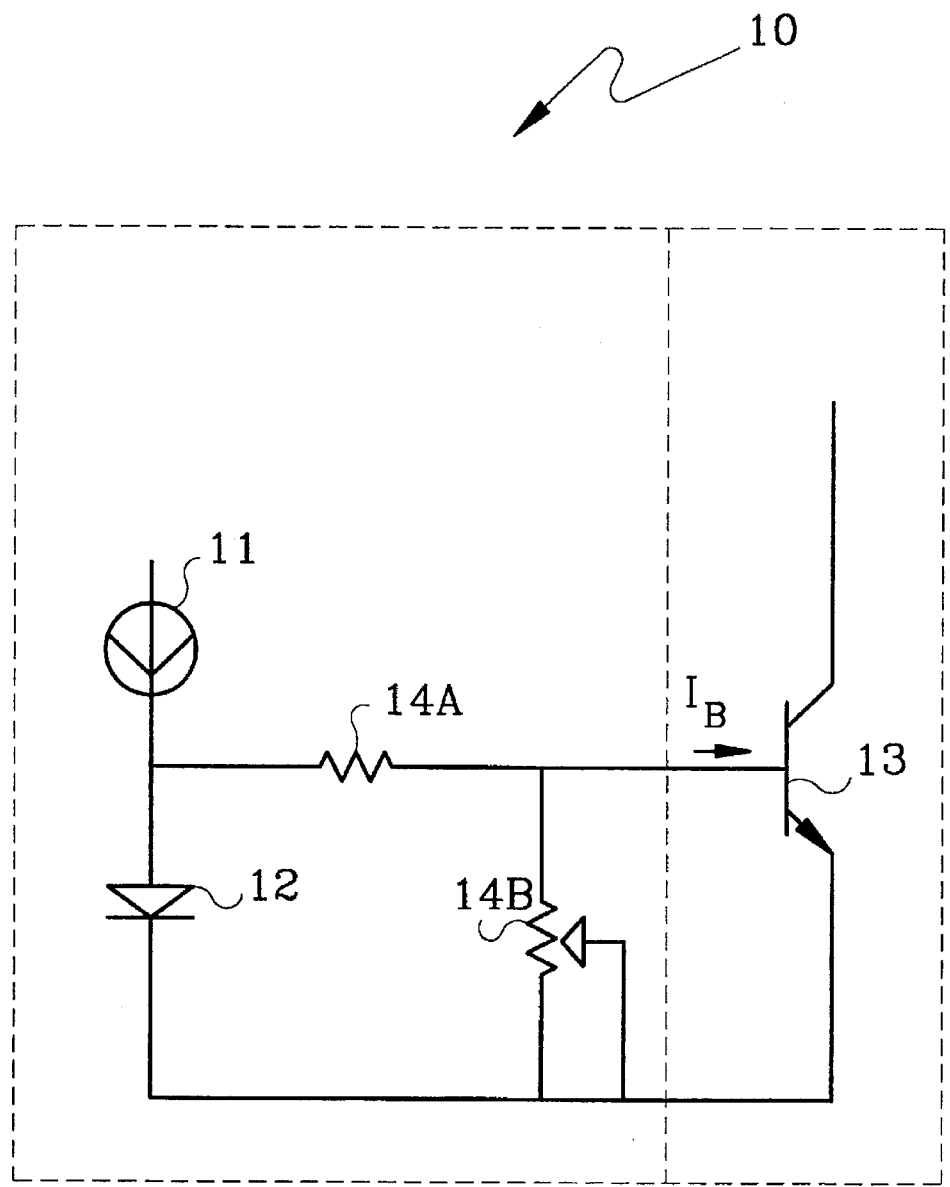
FIG. 1 is a circuit diagram illustrating the prior art.
Figure 2:
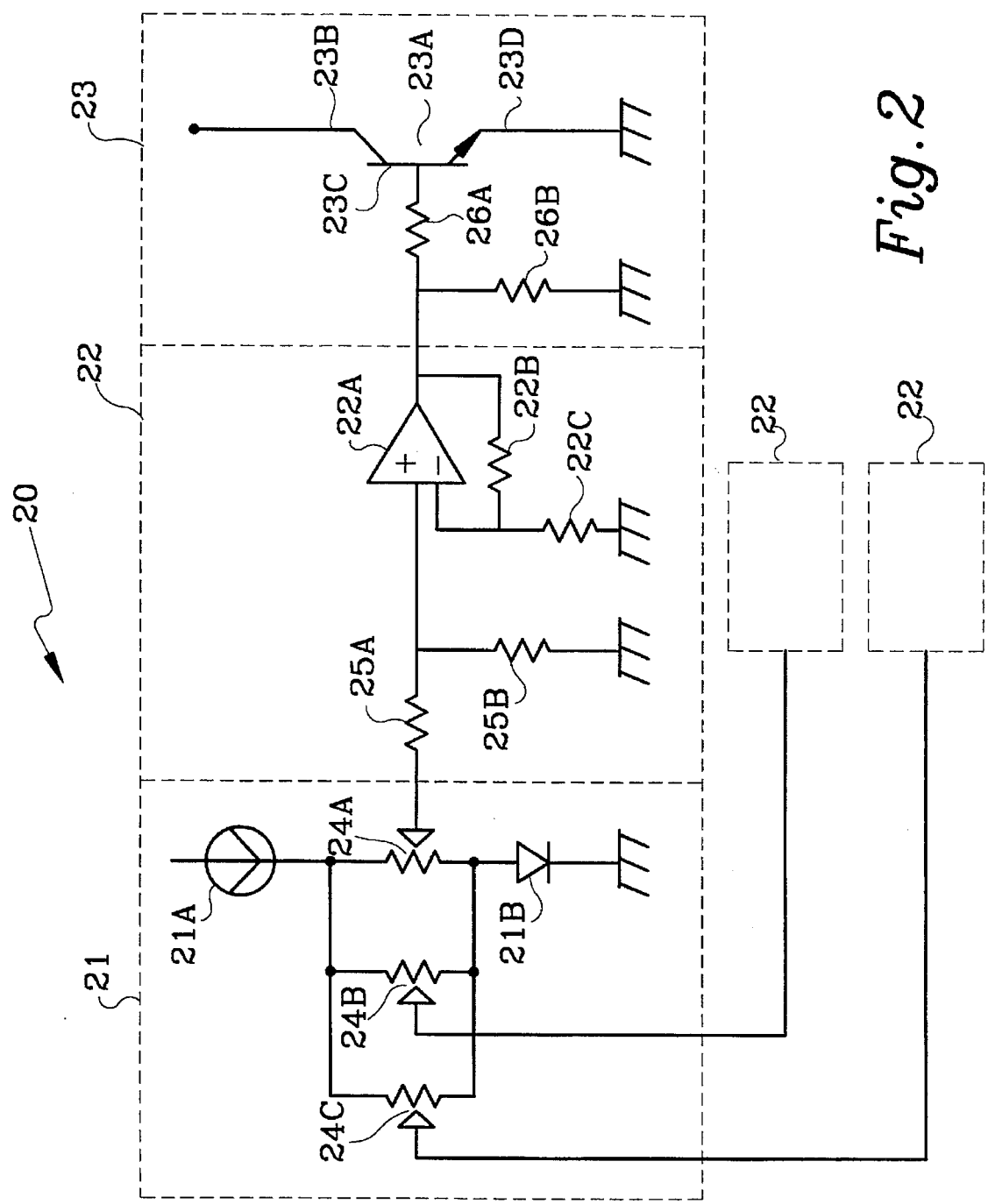
FIG. 2 is a circuit diagram of the invention.

FIG. 2 is a circuit diagram of the invention. Circuit 20 is comprised of three stages: the reference voltage stage 21, the isolation stage 22, and the RF amplifier stage 23. Each stage is discussed in detail below.

Reference voltage stage 21 is comprised of current source 21A, P-N junction device 21B, and potentiometers 24.

Current source 21A supplies current to P-N junction device 21B thus generating a temperature dependent reference voltage across P-N device 21B. Current through P-N device 21B must be controlled tightly so that the reference voltage will match the temperature coefficient of RF transistor 23A. Current source 21A is any current source capable of providing such precision current.

P-N junction device 21B is coupled between current source 21A and ground. The preferred embodiment uses a low cost low power P-N junction silicon diode, however, virtually any device capable of tracking the RF transistor's temperature coefficient may be used.

The selection of the P-N junction device(e.g. diode) should be noted. The use of generic low cost low power diodes to achieve precision biasing is unknown in the prior art. The prior art requires diodes which cost significantly more and consume significantly more power than the diodes used in the invention.

Current through P-N junction device 21B is carefully selected so that the thermal characteristics of the P-N device match the thermal characteristics of the base emitter junction of RF transistor 23A. Those skilled in the art understand that P-N junction devices have a temperature coefficient representative of the rate of change of voltage across the device with respect to temperature. It is also known that this temperature coefficient changes with respect to current through the P-N device. The invention takes advantage of this property to control the temperature coefficients of a P-N device so that virtually any P-N junction device can be made to match the temperature coefficient of the target RF transistor. In other words, the invention permits current through the P-N junction device to be selected so that a generic P-N device will match the temperature characteristic of the RF transistor.

Those skilled in the art understand there are several P-N junction devices, such as diodes, which may be used in the invention. One example of such an alternate P-N device is created using a transistor in which the collector and base are both coupled to the current source and the emitter is coupled to ground.

Potentiometers 24 allow fine voltage adjustment to trim the bias voltage of their associated RF transistor. Potentiometers 24 are coupled between current source 21A, diode 21B, and isolation stage 22. The first ends of potentiometers 24 are coupled to current source 21A, the second ends are coupled to diode 21B, and the sliding connections are coupled to isolation stage 22. Potentiometers 24 are standard variable resistance devices and are preferably on the order of 1 K ohm. Although potentiometers are used in the preferred embodiment, it is understood that virtually any method of adding a voltage offset may be used including, but not limited to, digital potentiometers or digital to analog converters.

FIG. 2 also illustrates multiple potentiometers 24 connected in parallel so that multiple RF transistors are biased from a single reference diode 21B. Potentiometers 24B and 24C both couple to isolation stages and RF amplifier stages identical to isolation stage 22 and RF amplifier stage 23.

Isolation stage 22 includes operational amplifier 22A, feedback resistors 22B and 22C, and scaling resistors 25. Isolation stage 22 provides current isolation between the reference voltage stage 21 and the RF amplifier stage 23.

Operational amplifier 22A and feedback resistors 22B and 22C are standard devices. Resistor 22B is coupled between the output and inverting input of operational amplifier 22A which yields a unity gain from amplifier 22A when resistor 22C is open. Resistor 22C allows the operational amplifier to have a gain greater than one. Resistor 22B is preferably 10 K ohms. Resistor 22C is not used in the preferred embodiment.

Scaling resistors 25 are high impedance compared to potentiometers 24 so that little current is used or diverted from diode 21B and, therefore, the temperature tracking capability of diode 21B is not significantly changed. The preferred impedance of scaling resistors 25A and 25B are 20 K ohms and 100 K ohms respectively.

RF amplifier stage 23 is comprised of RF transistor 23A and optional buffering resistors 26. RF transistor 23A includes a collector 23B, base 23C, and emitter 23D. Base 23C is coupled to the output of operational amplifier 22A. RF transistor 23A is any type of RF transistor which would benefit from the disclosed biasing circuit.

Optional buffering resistors 26 are coupled between RF transistor 23A and isolation stage 22. Buffering resistor 26A is used to improve RF characteristics. Buffering resistor 26B turns RF transistor 23A off when bias is removed(such as when operational amplifier 22A is turned off). Preferred impedance of buffering resistors 26A and 26B are 3.74 ohms and 51.1 ohms respectively.

Figure 3:
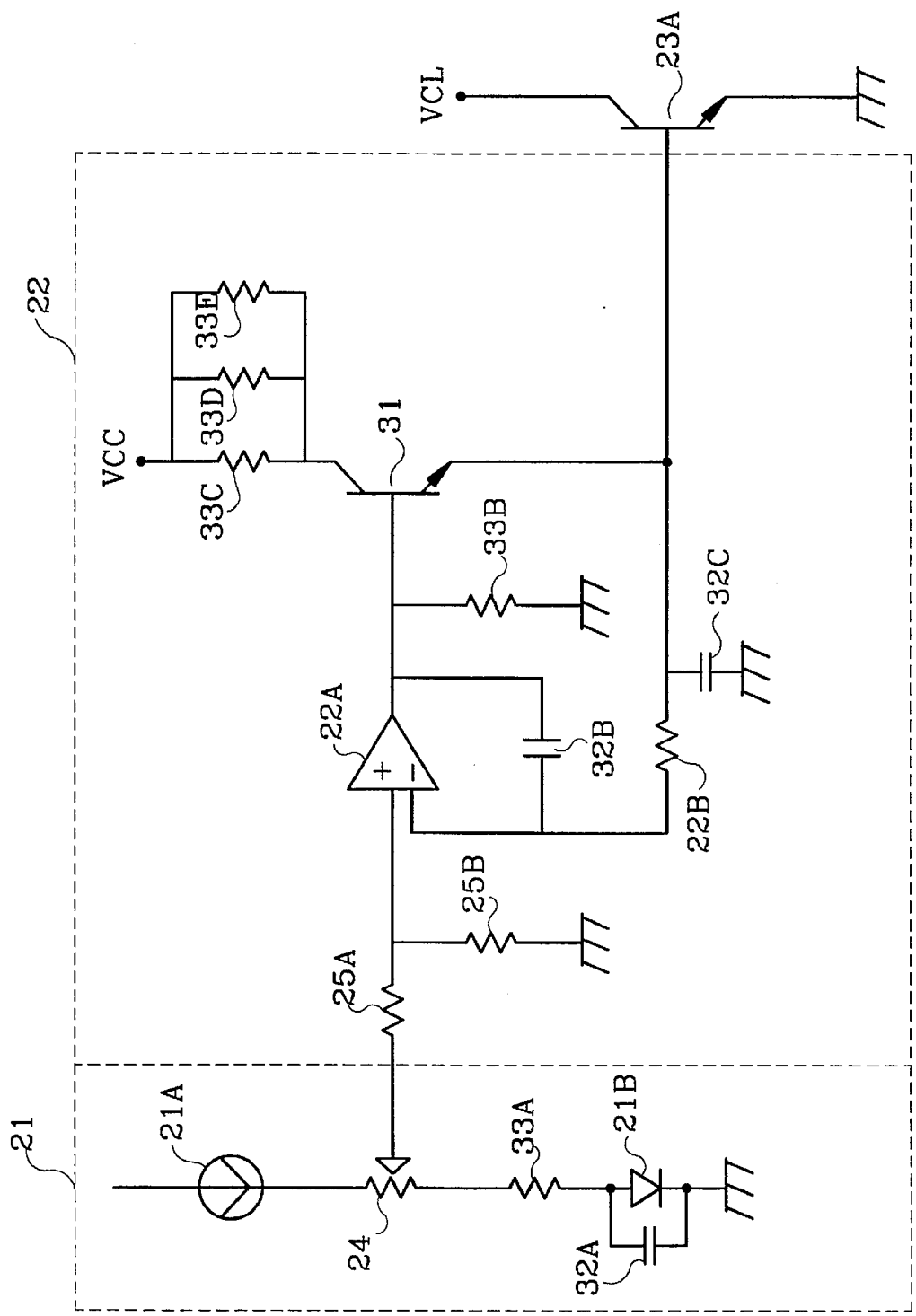
FIG. 3 is a circuit diagram of the invention embodied in a satellite communications system.

FIG. 3 is a circuit diagram of the invention embodied in a satellite communications system. Most elements are identical to elements in FIG. 2 and are numbered the same. Other elements are added to stabilize the circuit or otherwise improve operation of the circuit. The additional elements are discussed below.

Impedance reducing transistor 31 is part of the isolation stage 22 and is coupled between the output of operational amplifier 22A and the RF amplifier stage 23. Transistor 31 is used to lower the output impedance of isolation stage 22. The base of transistor 31 is coupled to the output of operational amplifier 22A and the emitter of transistor 31 is coupled to the RF amplifier stage 23.

Capacitors 32 are added to the reference voltage stage 21 and the isolation stage 22 for stabilizing the circuits. Capacitors 32 are connected as shown. Capacitor 32A is in parallel with diode 21B, capacitor 32B is coupled between the output and inverting input of operational amplifier 22A, and capacitor 32C is coupled between the output of the isolation stage 22 and ground. Preferred capacitance values are 10 pF for capacitor 32A, 0.1 µF for capacitor 32B, and 0.01 µF for capacitor 32C.

Biasing resistors 33 are added to the reference voltage stage 21 and the isolation stage 22. Biasing resistor 33A is a design choice to allow for optimum adjustment range of potentiometers 24. Its preferred impedance is 453 ohms. Resistor 33B maintains a load on the base of transistor 31 when voltage to operational amplifier 21A is removed. Its preferred impedance is 2 K ohms. Resistors 33C, 33D, and 33E are coupled between the power supply(not shown) and the collector of impedance reducing transistor 31. Resistors 33C, 33D and 33E are a design choice to reduce the power dissipation of transistor 31. Resistors 33C, 33D, and 33E are each 45.3 ohms.

It is understood that many alternate embodiments are envisioned by the invention. It is envisioned that the invention be used in any system which would benefit from a precisely biased class AB transistor or the like.

This description has been for descriptive purposes only and is not intended to limit the scope of the invention. Those skilled in the art recognize numerous alternate embodiments of the invention which deviate from the described embodiment but still perform the same work in substantially the same way to achieve substantially the same result and are therefore equivalent to the invention.

It is clear from the foregoing that the present invention represents a new and useful bias circuit for class AB power transistors and the like.

The embodiments of an invention in which an exclusive property or right is claimed are defined as follows:

1. A class AB amplifier comprising:
    a) an amplifying transistor having a collector, a base and an emitter, said transistor in a common-emitter configuration at least as far as bias is concerned; and,
    b) a bias circuit having,
        1) a precision current source having an output;
        2) a potentiometer having a first end coupled to said output of said current source, a second end, and a sliding connection,
        3) a P-N junction device having a first end coupled to said second end of said potentiometer, and a second end coupled to ground, and,
        4) an operational amplifier having a noninverting input coupled to said sliding connection, an inverting input, and an output coupled to both said inverting input and said base of said amplifying transistor.

2. The class AB amplifier according to claim 1 wherein said P-N junction device is a diode.

3. The class AB amplifier according to claim 1 wherein current through said P-N junction device is selected such that the thermal characteristics of said P-N junction device substantially match the thermal characteristics of the base emitter junction of said transistor.

4. The class AB amplifier according to claim 1 wherein said potentiometer includes multiple potentiometers in parallel with one another and wherein the sliding connection of each potentiometer provides a reference voltage for driving additional amplifying transistors.

5. The class AB amplifier according to claim 1 further comprising:
    a) a first scaling resistor connected in series between said sliding connection and said non-inverting input; and,
    b) a second scaling resistor connected between said non-inverting input and ground.

6. A bias circuit for biasing an RF transistor of a class AB amplifier where said RF transistor has a collector, a base and an emitter, said bias circuit comprising:
    a) precision current means for supplying a constant current;
    b) voltage reference means for providing a temperature dependent voltage which substantially matches the thermal characteristics of said RF transistor when said current is conducted through said reference means, said reference means having a first end and a second end, said second end coupled to ground;
    c) potentiometer means for providing variable resistance, said potentiometer means having a first end coupled to said current means, a second end coupled to said first end of said voltage reference means, and a sliding connection; and,
    d) current isolation means for providing current isolation between said base of said RF transistor and said voltage reference means so that changes in the base current of said RF transistor do not significantly change the current through said voltage reference means, said isolation means having an input coupled to said sliding connection and an output coupled to said base of said RF transistor.

7. The bias circuit according to claim 6 wherein said voltage reference means consists of a P-N junction device.

8. The bias circuit according to claim 7 wherein said P-N junction device is a diode.

9. The bias circuit according to claim 6 wherein said isolation means is an amplifier.

10. The bias circuit according to claim 9 wherein said amplifier comprises an operational amplifier having a non-inverting input, an inverting input, and output, said non-inverting input coupled to said sliding connection.

11. The bias circuit according to claim 10 wherein said amplifier further comprises a current enhancing transistor coupled between the output of said operational amplifier and said base of said RF transistor, said current enhancing transistor having a base coupled to said output of said operational amplifier and an emitter coupled to said base of said RF transistor.

12. The bias circuit according to claim 9 further comprising:
   a) a first scaling resistor connected in series between said sliding connection and said non-inverting input; and,
   b) a second scaling resistor connected in series between said non-inverting input and ground.

13. The bias circuit according to claim 12 wherein said scaling resistors are sufficiently large compared to said potentiometer means that current through said voltage reference means is not significantly affected.

14. The bias circuit according to claim 6 wherein said potentiometer means comprises multiple potentiometers arranged in parallel for providing reference voltage to multiple RF transistors.

15. A precision bias circuit capable of biasing multiple RF transistors using a single voltage reference device, said circuit comprising:
   a) a P-N junction device having a first end for receiving precision current and a second end coupled to ground;
   b) a precision current source coupled to said first end of said P-N junction device; and,
   c) at least two trim/isolation circuits, each of said trim/isolation circuits having,
      1) a trimming potentiometer interposed between said P-N junction device and said precision current source, said potentiometer having a first end coupled to said current source, a second end coupled to said first end of said P-N junction device, and a sliding connection,
      2) an amplifier having an input coupled to said sliding connection and an output coupled to a base of one of said multiple RF transistors.

16. The precision bias circuit according to claim 15 wherein said P-N junction is a diode.

17. The precision bias circuit according to claim 16 wherein said P-N junction is a low power diode.

18. The precision bias circuit according to claim 15 wherein current through said P-N junction device is selected such that the thermal characteristics of said junction device substantially matches the thermal characteristics of the base emitter junction of said RF transistor.

19. The precision bias circuit according to claim 15 wherein said amplifier is an operational amplifier having a non-inverting input coupled to said sliding connection.

* * * * *